(12) United States Patent
Watanabe et al.

(10) Patent No.: US 8,892,381 B2
(45) Date of Patent: Nov. 18, 2014

(54) TEST APPARATUS AND MANUFACTURING METHOD

(75) Inventors: Daisuke Watanabe, Saitama (JP);
Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 924 days.

(21) Appl. No.: 13/044,320

(22) Filed: Mar. 9, 2011

(65) Prior Publication Data

US 2011/0218752 A1    Sep. 8, 2011

Related U.S. Application Data

(63) Continuation of application No. PCT/JP2008/068603, filed on Oct. 14, 2008.

(51) Int. Cl.
*G01R 31/26* (2014.01)
*G06F 19/00* (2011.01)
*G01R 31/319* (2006.01)
*G01R 31/3185* (2006.01)

(52) U.S. Cl.
CPC .. *G01R 31/318511* (2013.01); *G01R 31/31926* (2013.01)
USPC ........ 702/82; 324/754.07; 702/118; 702/119; 714/740

(58) Field of Classification Search
CPC ........... G01R 31/2806; G01R 31/2831; G01R 31/2884; G01R 31/2886; G01R 31/31917; G01R 31/31926; G01R 31/318511; H01L 21/6835; H01L 2224/16; H01L 2924/01019; H01L 2924/30105; H01L 2924/3011; C07D 211/60; C07D 211/62; C08G 69/08; F27B 9/38; F27D 2003/0002; F27D 2099/0088; F27D 3/12; F27M 2001/1521; Y10S 414/11
USPC ........................ 702/57, 82, 89, 117, 118, 119; 324/750.08, 750.19, 754.07, 762.01, 324/762.02; 714/718, 724, 734, 738, 740, 714/744

See application file for complete search history.

(56) References Cited

U.S. PATENT DOCUMENTS 6,400,173 B1    6/2002  Shimizu et al.
6,727,723 B2    4/2004  Shimizu et al.
(Continued)

FOREIGN PATENT DOCUMENTS

JP    2001-210685 A    8/2001
(Continued)

OTHER PUBLICATIONS

English translation of Written Opinion (PCT/ISA/237) issued in PCT/JP2008/068603 (parent application) mailed in Jan. 2009. Japanese Written Opinion has been submitted in a previous IDS.

(Continued)

*Primary Examiner* — John H Le

(57) ABSTRACT

A test apparatus that tests a plurality of devices under test formed on a wafer under test includes a test substrate that faces the wafer under test and is electrically connected to the devices under test, a programmable device that is provided on the test substrate and changes a logic relationship of output logic data with respect to input logic data, according to program data supplied thereto, a plurality of input/output circuits that are provided on the test substrate to correspond to the devices under test and that each supply the corresponding device under test with a test signal corresponding to the output logic data of the programmable device, and a judging section that judges pass/fail of each device under test, based on operation results of each device under test according to the test signal.

11 Claims, 8 Drawing Sheets

(56) References Cited

U.S. PATENT DOCUMENTS 7,428,683 B2 * 9/2008 Dai et al. .................. 714/740
2004/0175850 A1 9/2004 Shimizu et al.

FOREIGN PATENT DOCUMENTS

| JP | 2002-139551 A | 5/2002 |
|----|---------------|--------|
| KR | 20010051506   | 6/2001 |
| TW | 530360        | 5/2003 |

OTHER PUBLICATIONS

KR Office Action/ Search Report and Computer Translation Dated Oct. 31, 2012; Application No. 1020117004021.
TW Office Action/ Search Report and Computer Translation Dated Jan. 4, 2013; Application No. 098134505.
International Search Report (ISR) issued in PCT/JP2008/068603 (parent application) mailed in Jan. 2009.
Written Opinion (PCT/ISA/237) issued in PCT/JP2008/068603 (parent application) mailed in Jan. 2009.

* cited by examiner

TEST APPARATUS AND MANUFACTURING METHOD

BACKGROUND

1. Technical Field

The present invention relates to a test apparatus and a manufacturing method.

2. Related Art

Generally, a test apparatus for testing a device under test such as a semiconductor circuit judges pass/fail of the device under test based on whether a prescribed characteristic of the device under test fulfills a certain specification when a prescribed signal is input to the device under test. Therefore, the test apparatus has functions corresponding to test conditions to be applied to the device under test, the type of device under test, and the like. The test apparatus is provided with test circuits for realizing these functions, as shown in Patent Document 1, particularly FIG. 5, for example. Patent Document 1: Japanese Patent Application Publication No. 2002-139551

The test circuits described above each have unique functions. Therefore, when testing a device under test using another function, a test circuit must be added or replaced. If test circuits cannot be added or replaced in the test apparatus, the device under test must be tested using another test apparatus.

SUMMARY

Therefore, it is an object of an aspect of the innovations herein to provide a test apparatus and a manufacturing method, which are capable of overcoming the above drawbacks accompanying the related art. This object can be achieved by combinations described in the independent claims. According to a first aspect related to the innovations herein, provided is a test apparatus that tests a plurality of devices under test formed on a wafer under test. The test apparatus comprises a test substrate that faces the wafer under test and is electrically connected to the devices under test; a programmable device that is provided on the test substrate and changes a logic relationship of output logic data with respect to input logic data, according to program data supplied thereto; a plurality of input/output circuits that are provided on the test substrate to correspond to the devices under test and that each supply the corresponding device under test with a test signal corresponding to the output logic data of the programmable device; and a judging section that judges pass/fail of each device under test, based on operation results of each device under test according to the test signal.

According to a second aspect related to the innovations herein, provided is a method of manufacturing a test substrate that is electrically connected to a plurality of devices under test formed on a wafer under test and that tests the devices under test. The method comprises forming, on the test substrate using photolithography, a programmable device that generates a digital test signal corresponding to program data supplied thereto; forming, on the test substrate using photolithography, a test circuit that generates an analog test signal; forming, on the test substrate using photolithography, a plurality of input/output circuits that correspond to a plurality of terminals of each device under test and that are each electrically connected to the corresponding terminal; and forming, on the test substrate using electron beam lithography, at least a portion of wires that connect the programmable device and the input/output circuits and wires that connect the test circuit and the input/output circuits, according to a type of device under test to be tested.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
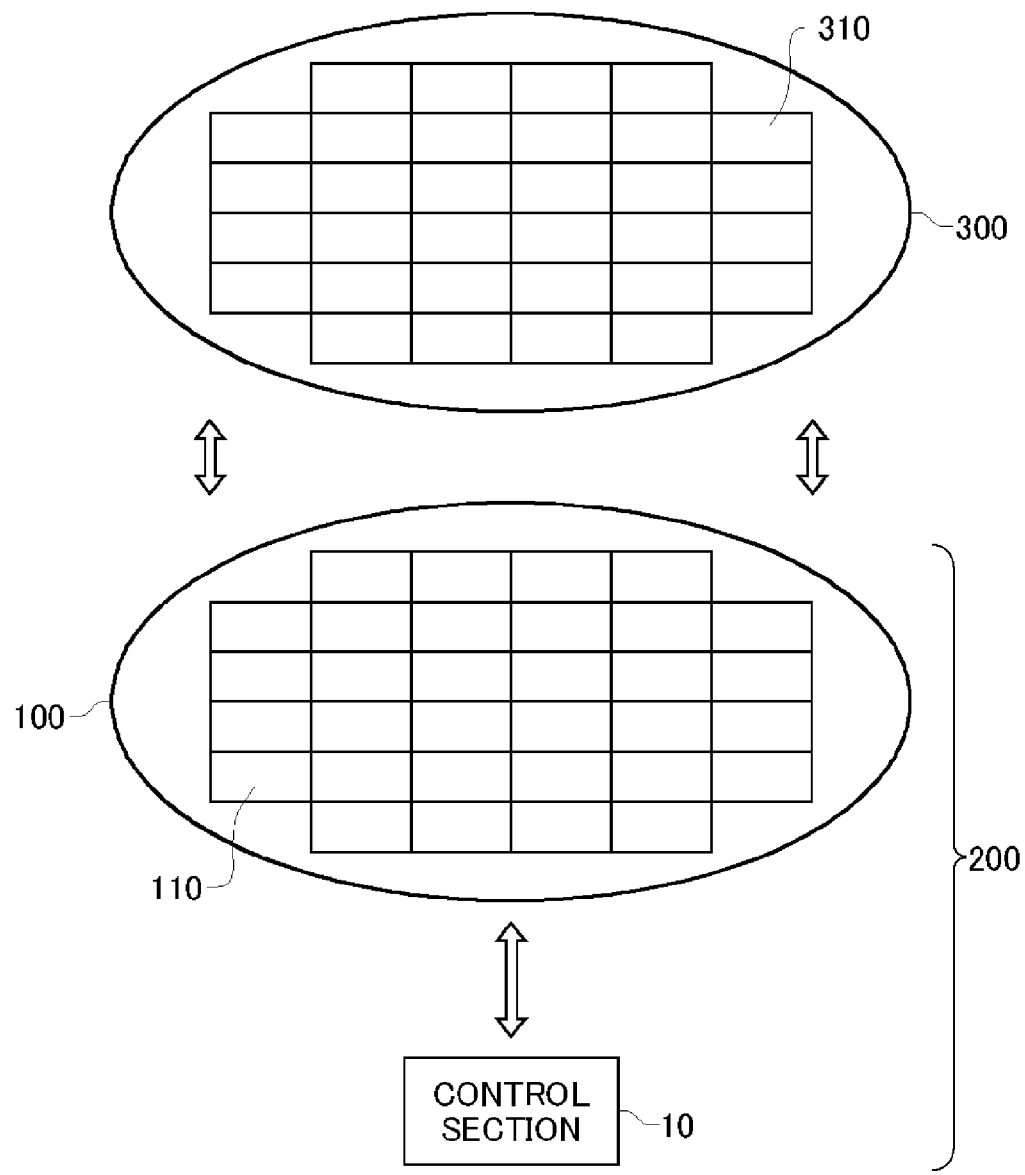
FIG. 1 shows an overview of a test apparatus 200.

FIG. 1 shows an overview of a test apparatus 200. The test apparatus 200 tests a plurality of devices under test 310 formed on a wafer under test 300, and includes a test substrate 100 and a control section 10.

The wafer under test 300 may be a disc-shaped semiconductor substrate. More specifically, the wafer under test 300 may be silicon, a composite semiconductor, or another type of semiconductor substrate. The devices under test 310 may be formed on the wafer under test 300 using a semiconductor process such as lithography.

The test substrate 100 is electrically connected to the wafer under test 300. More specifically, the test substrate 100 is electrically connected en bloc to the plurality of devices under test 310 formed on the wafer under test 300. The test substrate 100 includes a plurality of circuit blocks 110.

The test substrate 100 may be a wafer formed of the same semiconductor material as the wafer under test 300. For example, the test substrate 100 may be a silicon substrate. The test substrate 100 may be formed of a semiconductor material whose thermal expansion coefficient is substantially the same as that of substrate of the wafer under test 300. The test substrate 100 may be a print substrate.

The circuit blocks 110 correspond to the devices under test 310. In the present embodiment, the circuit blocks 110 correspond one-to-one with the devices under test 310. Each circuit block 110 is electrically connected to the corresponding device under test 310 to test this device under test 310.

The test substrate 100 of the present embodiment has substantially the same diameter as the wafer under test 300. Each circuit block 110 may be formed in a region of the test substrate 100 corresponding to a region of the wafer under test 300 where a device under test 310 is formed. For example, the circuit blocks 110 may be formed such that the region in which each circuit block 110 is formed overlaps with the region in which a device under test 310 is formed when the test substrate 100 and the wafer under test 300 are stacked.

The devices under test 310 and the circuit blocks 110 may be provided on surfaces of the wafer under test 300 and the test substrate 100 that face each other. Instead, the circuit blocks 110 may be provided on the back of the surface of the test substrate 100 facing the wafer under test 300. In this case, each circuit block 110 may be electrically connected to the corresponding device under test 310 through a via hole formed in the test substrate 100.

Here, electrical connection may refer to a state in which electrical signals can be transmitted between two components. For example, input/output pads of the circuit blocks 110 and devices under test 310 may directly contact each other or indirectly contact each other via a conductor to achieve electrical connection. The test apparatus 200 may include a probe member such as a membrane sheet between the wafer under test 300 and the test substrate 100, and this membrane sheet may have substantially the same diameter as the wafer under test 300 and the test substrate 100. This membrane sheet has bumps to create electrical connections between corresponding input/output pads of the circuit blocks 110 and the devices under test 310. The test apparatus 200 may include an anisotropic conductive sheet between the membrane sheet and the test substrate 100.

The input/output pads of the circuit blocks 110 and the devices under test 310 may be electrically connected in a non-contact state using capacitive coupling, also known as electrostatic coupling, or inductive coupling, also known as magnetic coupling. A portion of the transmission lines between the input/output pads of the circuit blocks 110 and the devices under test 310 may be optical transmission lines.

The test substrate 100 of the present embodiment is formed of the same semiconductor material as the wafer under test 300, and therefore the test substrate 100 can maintain a good electrical connection with the wafer under test 300 even when the surrounding temperature fluctuates. Therefore, even if the wafer under test 300 is heated during testing, for example, the wafer under test 300 can be accurately tested.

If the test substrate 100 is formed of a semiconductor material, the circuit blocks 110 can be easily formed on the test substrate 100 with high density. For example, the circuit blocks 110 can be easily formed on the test substrate 100 with high density by using a semiconductor process such as lithography. As a result, a large number of circuit blocks 110 corresponding to a large number of devices under test 310 can be formed relatively easily on the test substrate 100.

When the circuit blocks 110 are provided on the test substrate 100, the size of the control section 10 can be decreased. The control section 10 should have a function to provide notification concerning the timing at which testing of the circuit blocks 110 is begun, a function to read test results of the circuit blocks 110, and a function to supply drive power to the circuit blocks 110 and the devices under test 310, for example.

In the test apparatus 200 of the present embodiment, the circuit blocks 110 can be arranged near the devices under test 310. Therefore, transmission loss between the circuit blocks 110 and the devices under test 310 can be decreased, and signals can be transmitted with high accuracy without providing output drivers or the like to the circuit blocks 110.

Figure 2:
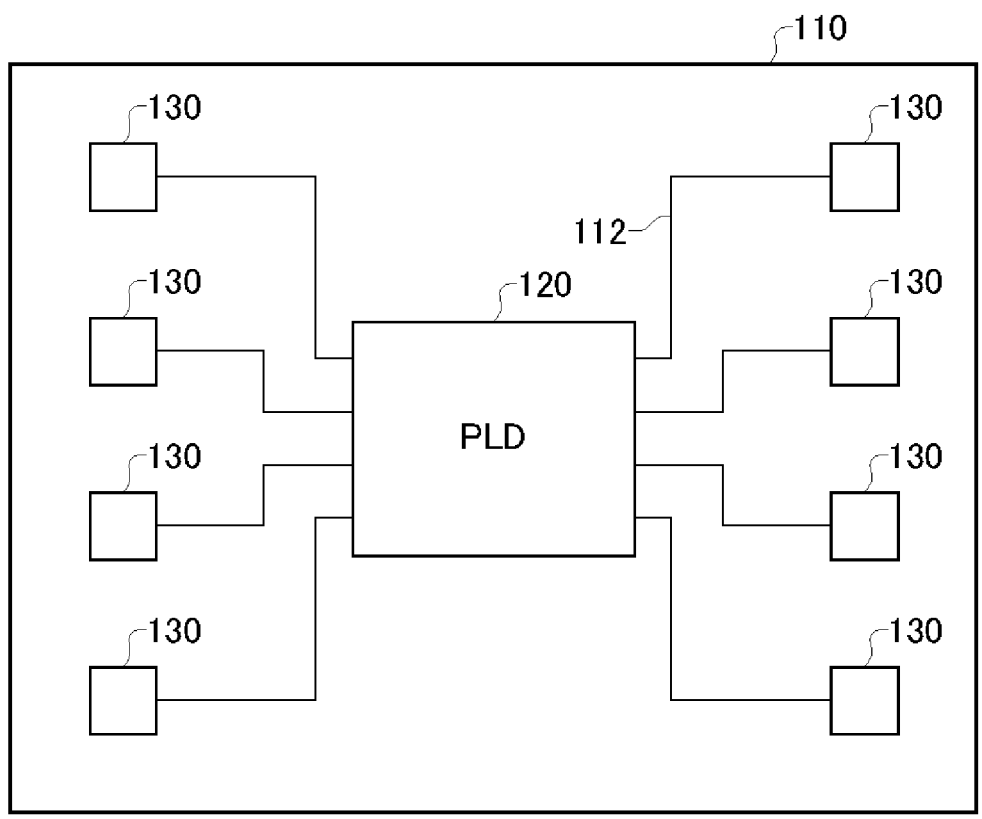
FIG. 2 shows an exemplary configuration of a circuit block 110.

FIG. 2 shows an exemplary configuration of a circuit block 110. The circuit block 110 includes a programmable device 120, a plurality of input/output circuits 130, and a plurality of wires 112. The programmable device 120 is provided on the test substrate 100, and changes the logic relationship of output logic data with respect to input logic data, according to program data from the control section 10.

The programmable device 120 may change the connections of logic circuits therein according to the program data. The programmable device 120 may be a PLD, FPGA, or the like. A programmable device 120 according to the present embodiment is provided to each circuit block 110, such that the programmable devices 120 correspond respectively to the devices under test 310.

The programmable device 120 functions as a test circuit that tests the corresponding device under test 310. The programmable device 120 may generate a digital signal having a pattern obtained by performing a logic operation corresponding to the program data in pattern data supplied thereto. The programmable device 120 may output the generated digital signal to the device under test 310 via a pin designated by the program data.

The programmable device 120 may acquire, from a pin corresponding to the program data, the signal output from the device under test 310. The programmable device 120 may judge pass/fail of the device under test 310 by performing a logic operation corresponding to the program data on the acquired signal.

The programmable device 120 may be capable of functioning as a known logic circuit loaded on a conventional test circuit. Therefore, the versatility of the test apparatus 200 can be increased by changing the program data supplied to the programmable device 120, according to the type of device under test 310 or the testing to be performed on the device under test 310. The programmable device 120 may include a memory to hold the program data supplied thereto in a replaceable manner. The control section 10 may function as a program control section that changes the program data supplied to the programmable device 120.

The input/output circuits 130 are provided on the test substrate 100 to correspond to the terminals of the device under test 310. Each input/output circuit 130 is electrically connected to a pin of the programmable device 120 via a wire 112. Each input/output circuit 130 transmits signals between the corresponding pin of the programmable device 120 and the corresponding terminal of the device under test 310.

Each input/output circuit 130 may include a pad that contacts the terminals of the device under test 310 and an input/output buffer circuit that transmits signals. As described above, the circuit block 110 is arranged near the device under test 310, and can therefore transmit signals with high accuracy between the programmable device 120 and the device under test 310, without using a driver circuit or the like.

Figure 3:
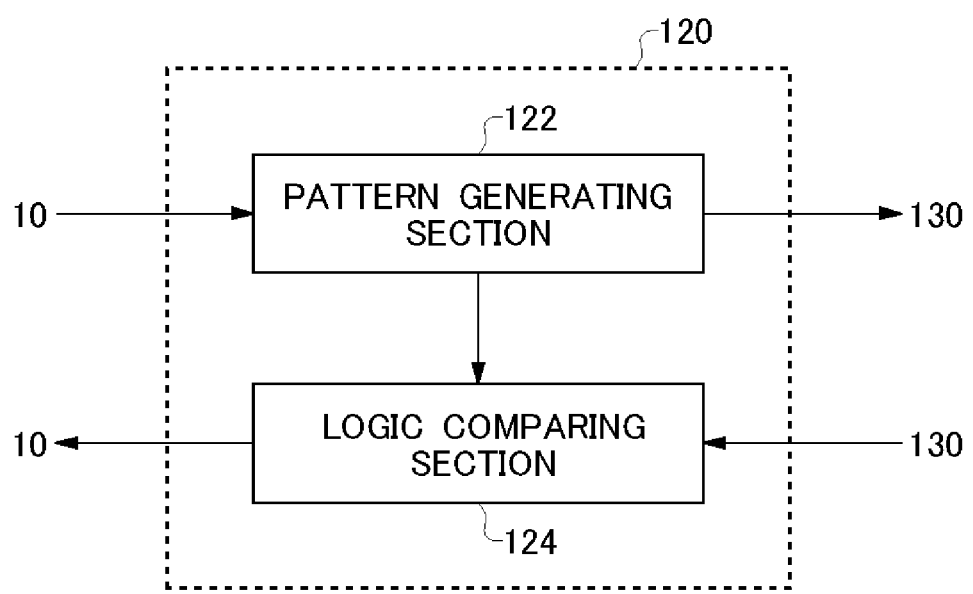
FIG. 3 is a block diagram showing an exemplary functional configuration of the programmable device 120.

FIG. 3 is a block diagram showing an exemplary functional configuration of the programmable device 120. The programmable device 120 of the present embodiment is programmed as a circuit that executes a function test of the device under test 310. A function test may be a test judging whether a logic circuit of the device under test 310 operates correctly when a prescribed logic pattern is input to the logic circuit.

The programmable device 120 functions as a pattern generating section 122 and a logic comparing section 124. The pattern generating section 122 generates a digital signal that has a prescribed logic pattern. For example, the pattern generating section 122 generates a plurality of digital signals with sequentially changing logic patterns using a pseudorandom bit sequence (PRBS). In this case, at least a portion of the programmable device 120 functions as a circuit that generates a pseudorandom bit sequence.

The pattern generating section 122 may generate digital signals that include logic patterns corresponding to pattern data supplied from the control section 10. In this case, the pattern generating section 122 may function as an algorithmic pattern generator (ALPG) that generates logic patterns according to algorithms determined by the program data. The type of logic pattern generated by the pattern generating section 122 can be determined by the program data supplied to the programmable device 120.

The logic comparing section 124 may function as a judging section that judges pass/fail of the device under test 310 based on the operational result of the device under test 310 supplied with the digital signal described above. The logic comparing section 124 may receive response signals of the device under test 310 via the input/output circuits 130, and judge whether the logic value patterns of the response signals match prescribed expected value patterns. The expected value patterns may be provided from the pattern generating section 122.

As another example, the programmable device 120 may measure the logic patterns of the response signals of the devices under test 310, and output the results to the control section 10. In this case, the control section 10 may function as a judging section that compares the logic patterns to the expected value patterns.

With this configuration, a function test of the device under test 310 can be performed. Furthermore, by changing the program data supplied to the programmable device 120, a variety of tests can be performed. For example, the programmable device 120 can be set by the program data to perform a DC test, an analog test, or the like of the device under test 310.

A DC test involves measuring current or voltage supplied to the device under test 310 when a constant voltage or current is applied to the device under test 310. Therefore, the internal resistance of a pin of the device under test 310 can be measured, for example. An analog test involves measuring the waveform of a signal output by the device under test 310 when a prescribed analog signal is supplied to the device under test 310.

When performing these tests, the programmable device 120 may operate together with another analog circuit to generate a test signal and measure the response signal. For example, the circuit block 110 may include an analog signal that modulates the amplitude, phase, or the like of the digital signal generated by the programmable device 120. The circuit block 110 may include a signal that converts the response signal of the device under test 310 into a digital signal and inputs the digital signal to the programmable device 120.

The control section 10 may change the program data supplied to the programmable device 120, based on the comparison results of the logic comparing section 124. In other words, the control section 10 may determine the content of the next test to be performed based on the test results of the device under test 310, and supply the programmable device 120 with program data corresponding to this testing content. As a result, a variety of tests can be performed integrally by a single test apparatus 200. In other words, the functional configuration, usage, and the like of the circuit block 110 can be changed in real time during testing of the device under test 310 for a variety of tests.

Furthermore, the programmable device 120 may change its own input/output logic relationship independently of the control of the control section 10, based on the judgment result for the corresponding device under test 310. In this case, each programmable device 120 may include a microcomputer that controls the input/output logic relationship of the programmable device 120.

The microcomputer may be supplied with a microcode, in the initial instructions from the control section 10, for changing the functional configuration of the programmable device 120 according to the test results of the corresponding device under test 310. In this case, the microcomputer may change the functional configuration of the programmable device 120 based on self-diagnostic results for each type of test initiated according to the initial instructions. With this control, a plurality of programmable devices 120 can independently control the tests performed thereby. Therefore, the time needed for each programmable device 120 to transmit information to an integrated control section 10 can be decreased, thereby decreasing the testing time.

Figure 4:
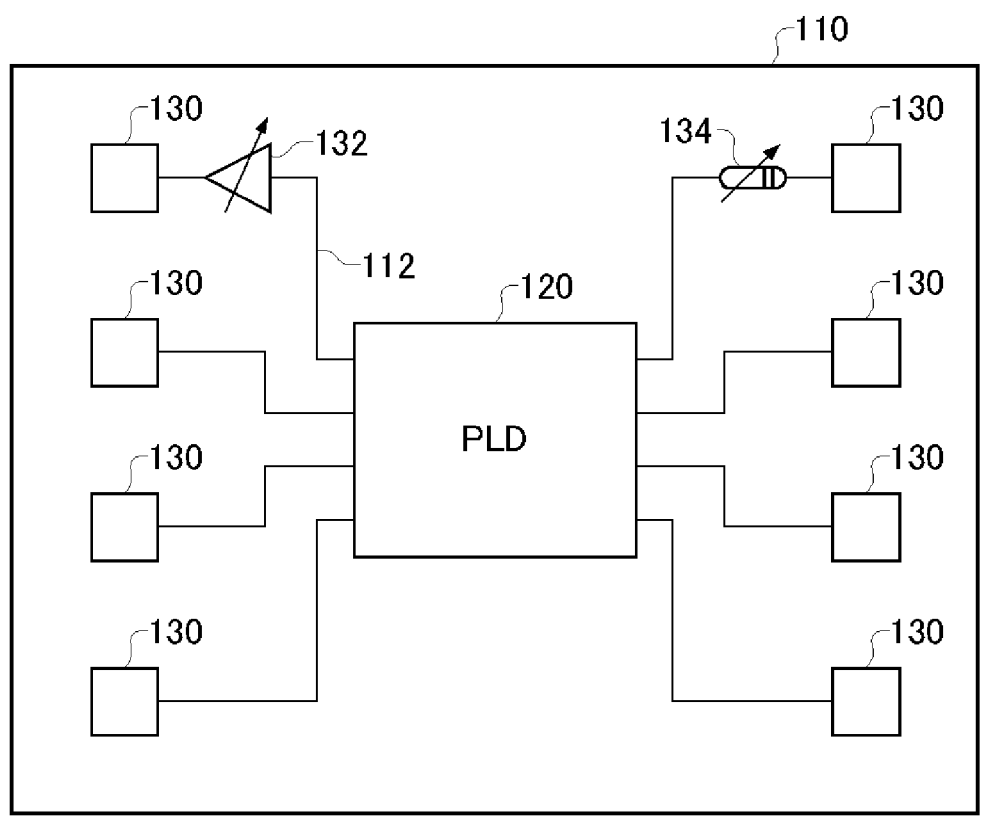
FIG. 4 shows another exemplary configuration of a circuit block 110.

FIG. 4 shows another exemplary configuration of a circuit block 110. The circuit block 110 of the present embodiment includes a plurality of analog circuits in addition to the configuration of the circuit block 110 described in relation to FIG. 2. For example, the circuit block 110 of the present embodiment includes a level changing circuit 132 and a delay circuit 134 as analog circuits.

These analog circuits may generate analog test signals corresponding to input/output signals of the programmable device 120. The level changing circuit 132 may adjust the signal level of output logic data from the programmable device 120. The signal level can refer to the amplitude and/or the offset, e.g. the DC level, of a signal. The delay circuit 134 may delay the output logic data of the programmable device 120. Characteristics such as gain and delay amount of the analog signals may be controlled by a control signal from the control section 10.

With this configuration, the circuit block 110 can generate analog signals corresponding to the output logic data of the programmable device 120. The analog circuits may be provided to correspond to a portion of the pins of the programmable device 120. As a result, the circuit block 110 can input and output both analog signals and digital signals.

The level changing circuit 132 may be provided between the device under test 310 and an input/output circuit 130 that receives a signal from the device under test 310. In this case, the analog output signal of the device under test 310 can be converted to have a signal level corresponding to the characteristics of the programmable device 120. Therefore, a device under test 310 in which analog terminals and digital terminals are mixed can be tested.

The level changing circuit 132 may be included within an input/output circuit 130. In this case, a portion of the input/output circuits 130 may include a level changing circuit 132, or all of the input/output circuits 130 may include a level changing circuit 132.

Figure 5:
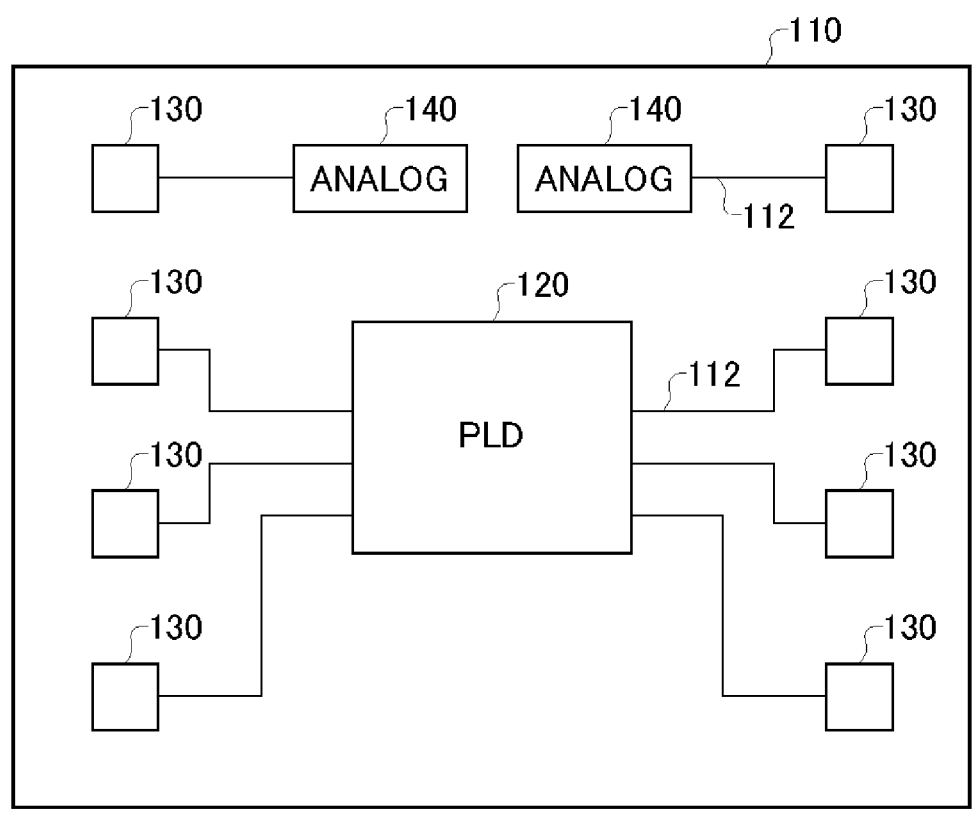
FIG. 5 shows another exemplary configuration of a circuit block 110.

FIG. 5 shows another exemplary configuration of a circuit block 110. The circuit block 110 of the present embodiment further includes a test circuit 140 that generates or measures an analog signal, in addition to the configuration of the circuit block 110 shown in FIG. 2. The test circuit 140 is connected to an input/output circuit 130 corresponding to an analog terminal of the device under test 310. The programmable device 120 may be connected to an input/output circuit 130 corresponding to a digital terminal of the device under test 310.

With this configuration, the circuit block 110 can test a device under test 310 in which analog terminals and digital terminals are mixed. The test circuit 140 and the programmable device 120 may operate in synchronization. These circuits may be provided with a common operation clock from the control section 10.

Figure 6:
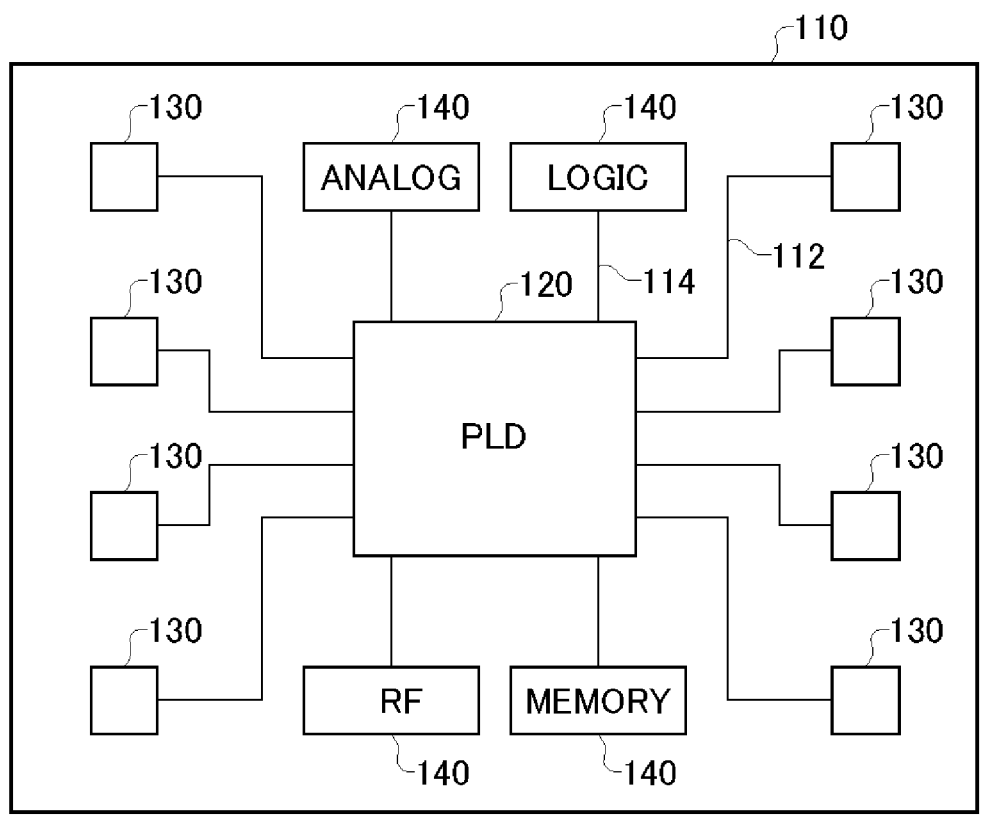
FIG. 6 shows another exemplary configuration of a circuit block 110.

FIG. 6 shows another exemplary configuration of a circuit block 110. The circuit block 110 of the present embodiment includes a plurality of test circuits 140 in addition to the configuration of the circuit block 110 shown in FIG. 2. The test circuits 140 of the present embodiment may be circuits performing the same tests as conventional test circuits. For example, the test circuits 140 may each be a circuit performing an analog test, a logic test, i.e. a function test, an RF test, i.e. a high-frequency test, or a memory test.

The test circuits 140 are electrically connected to the common programmable device 120 via wires 114. The programmable device 120 changes the connections among the test circuits 140 and the input/output circuits 130, according to the program data supplied thereto. By changing the setting of the programmable device 120, devices under test 310 with different arrangements can be tested using the same test apparatus 200.

Figure 7:
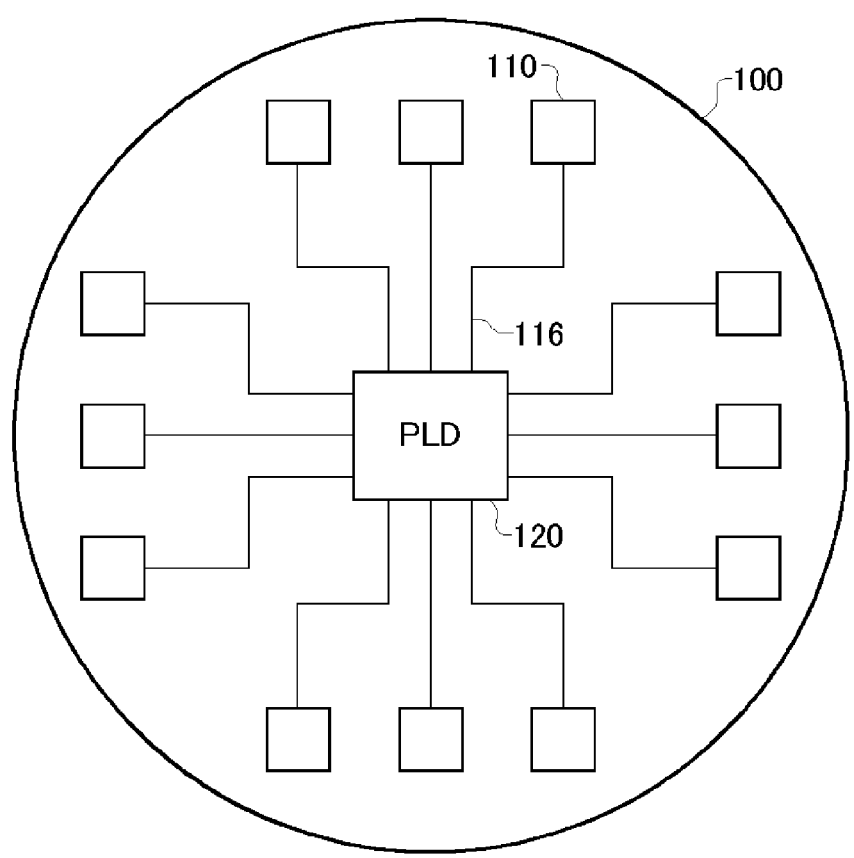
FIG. 7 shows another exemplary configuration of a test substrate 100.

FIG. 7 shows another exemplary configuration of a test substrate 100. In FIGS. 1 to 6, a programmable device 120 was provided to correspond to each device under test 310, but in the test substrate 100 of the present embodiment, a common programmable device 120 is provided for a plurality of devices under test 310.

The circuit block 110 of the present embodiment need not include the programmable device 120. In the test substrate 100, the programmable device 120 is provided in a different region than the circuit blocks 110. The programmable device 120 may be arranged in the center of the test substrate 100, or at an edge of the test substrate 100. The programmable device 120 may be arranged on the back surface of the test substrate 100. A single programmable device 120 may be provided in a plurality of divided regions on the test substrate 100.

The programmable device 120 is electrically connected to each of the circuit blocks 110 via wires 116, and supplies a common signal to the circuit blocks 110. The programmable device 120 may generate a logic pattern of the test signals to be generated by the circuit blocks 110. The signal output by the programmable device 120 can be changed according to the program data. As a result, a variety of tests can be performed.

Figure 8:
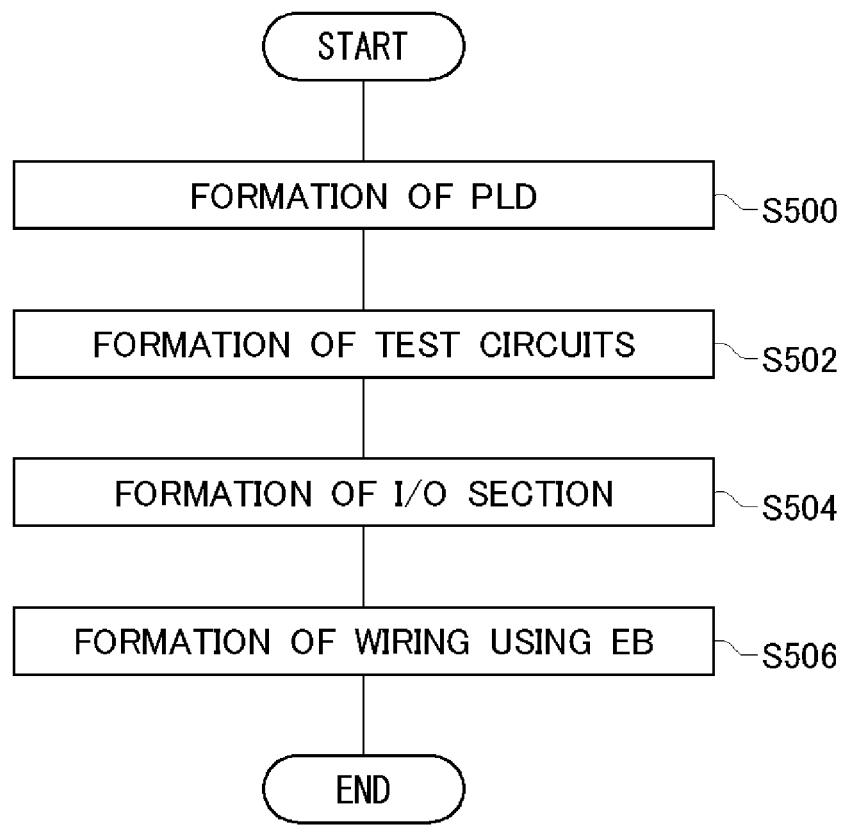
FIG. 8 is a flow chart showing a method for manufacturing the test substrate 100.

FIG. 8 is a flow chart showing a method for manufacturing the test substrate 100. The manufacturing method of the present embodiment involves using photolithography to form the programmable devices 120, the test circuits 140, and the input/output circuits 130 described in relation to FIGS. 1 to 7. At least a portion of the wires 112, wires 114, and wires 116 described in relation to FIGS. 1 to 7 are formed using electron beam lithography.

Specifically, by using a mask and photolithography to form the test resources such as the programmable devices 120, a plurality of test substrates 100 including these test resources can be easily manufactured. By using an electron beam to form the wires between the test resources based on the pin arrangement or the like of the device under test 310, a test substrate corresponding to a certain type of device under test 310 can be manufactured.

For example, when manufacturing the test substrate 100 described in relation to FIG. 6, the programmable device 120, the test circuits 140 that generate analog test signals, and the input/output circuits 130 electrically connected to corresponding terminals of the device under test 310 are formed using photolithography (S500, S502, S504). These circuits may be formed in any order.

At least a portion of the wires connecting the programmable device 120 and the input/output circuits 130 and the wires connecting the test circuits 140 and the input/output circuits 130 are formed using electron beam lithography, according to the type of device under test 310 to be tested (S506). As a result, the connections between the input/output circuits 130 and the programmable device 120 or the like can be adjusted according to the pin arrangement of the device under test 310.

With this manufacturing method, it is not necessary to create a photolithography mask for each type of device under test 310, thereby decreasing the manufacturing cost. Furthermore, compared to forming all of the circuits of a circuit block 110 using electron beam photolithography for each type of device under test 310, this manufacturing method achieves a shorter manufacturing time.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a plurality of devices under test formed on a wafer under test, the test apparatus comprising:
   a test substrate that faces the wafer under test and is electrically connected to the devices under test;
   a programmable device that is provided on the test substrate and changes a logic relationship of output logic data with respect to input logic data, according to program data supplied thereto;
   a plurality of input/output circuits that are provided on the test substrate to correspond to the devices under test and that each supply the corresponding device under test with a test signal corresponding to the output logic data of the programmable device;
   a judging section that judges pass/fail of each device under test, based on operation results of each device under test according to the test signal; and
   a program control section that changes the program data supplied to the programmable device based on the judgment results of the judging section.

2. The test apparatus according to claim 1, further comprising a plurality of analog circuits that are provided on the test substrate to correspond to the devices under test and that generate analog versions of the test signals corresponding to the output logic data of the programmable device.

3. The test apparatus according to claim 2, wherein
   each analog circuit includes a level changing circuit that adjusts a signal level of an input/output signal of the programmable device.

4. The test apparatus according to claim 2, wherein
   each analog circuit includes a delay circuit that delays an input/output signal of the programmable device.

5. The test apparatus according to claim 1, wherein
   each input/output circuit receives a response signal output by the corresponding device under test and inputs a logic pattern of the response signal to the programmable device, and the programmable device further functions as the judging section.

6. The test apparatus according to claim 1, wherein
   the programmable device is provided in common to the plurality of devices under test.

7. The test apparatus according to claim 1, wherein
a plurality of the programmable devices are provided to correspond to the plurality of devices under test.

8. The test apparatus according to claim 1, further comprising a plurality of test circuits electrically connected to the programmable device in common, wherein
the programmable device changes connections between the test circuits and the input/output circuits according to the program data supplied thereto.

9. The test apparatus according to claim 1, wherein
the programmable device changes the logic relationship between input and output thereof based on the judgment results of the judging section.

10. The test apparatus according to claim 1, wherein
a plurality of the programmable devices each include a microcomputer that changes the logic relationship between input and output of the programmable device based on test results of the corresponding device under test.

11. The test apparatus according to claim 10, wherein
each microcomputer controls the logic relationship of the programmable device in which the microcomputer is provided, independently of the microcomputers in other programmable devices.

* * * * *